United States Patent
Fujino et al.

(10) Patent No.: US 10,067,417 B2
(45) Date of Patent: Sep. 4, 2018

(54) MASK PLATE, MASK EXPOSURE DEVICE AND MASK EXPOSURE METHOD

(71) Applicant: BOE TECHNOLOGY GROUP CO., LTD., Beijing (CN)

(72) Inventors: Seiji Fujino, Beijing (CN); Song Zhang, Beijing (CN); Tao Wang, Beijing (CN); Jing Gao, Beijing (CN); Xiaobo Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 69 days.

(21) Appl. No.: 14/894,147

(22) PCT Filed: Jul. 20, 2015

(86) PCT No.: PCT/CN2015/084445
§ 371 (c)(1),
(2) Date: Nov. 25, 2015

(87) PCT Pub. No.: WO2016/150043
PCT Pub. Date: Sep. 29, 2016

(65) Prior Publication Data
US 2017/0090280 A1 Mar. 30, 2017

(30) Foreign Application Priority Data
Mar. 26, 2015 (CN) .......................... 2015 1 0136925

(51) Int. Cl.
*G03F 1/38* (2012.01)
*G03F 1/76* (2012.01)
*G03F 7/20* (2006.01)

(52) U.S. Cl.
CPC ................. *G03F 1/76* (2013.01); *G03F 1/38* (2013.01); *G03F 7/70058* (2013.01)

(58) Field of Classification Search
None
See application file for complete search history.

(56) References Cited

U.S. PATENT DOCUMENTS

2004/0012776 A1* 1/2004 Bae .................. G01N 21/95684
356/237.4
2005/0277031 A1* 12/2005 Yan ........................ B82Y 10/00
430/5

(Continued)

FOREIGN PATENT DOCUMENTS

CN          1704848 A       12/2005
CN        101250685 A        8/2008

(Continued)

OTHER PUBLICATIONS

Written Opinion of the International Searching Authority and International Search Report for International application No. PCT/CN2015/084445, dated Sep. 8, 2015. Translation provided by Dragon Intellectual Property Law Firm.

(Continued)

*Primary Examiner* — Stephen Rosasco
(74) *Attorney, Agent, or Firm* — Harness, Dickey & Pierce, P.L.C.

(57) ABSTRACT

The present disclosure provides a mask plate, a mask exposure device and a mask exposure method, belongs to the field of display technology. The mask plate includes a tray with at least one mask locating slot, and a mask is arranged in each mask locating slot. By the mask plate, the mask exposure device and the mask exposure method provided by the present disclosure, an effective mask with a closed-loop shaped opening may be provided, thereby improving a quality of a film formed on a substrate.

11 Claims, 4 Drawing Sheets

(56) References Cited

U.S. PATENT DOCUMENTS

| | | |
|---|---|---|
| 2008/0213679 A1 | 9/2008 | Miyakawa et al. |
| 2010/0118912 A1 | 5/2010 | Lai et al. |
| 2015/0131071 A1* | 5/2015 | Kim .................. G03F 7/707 355/72 |
| 2017/0090280 A1 | 3/2017 | Fujino et al. |

FOREIGN PATENT DOCUMENTS

| | | |
|---|---|---|
| CN | 102011088 A | 4/2011 |
| CN | 102629078 A | 8/2012 |
| CN | 102854753 A | 1/2013 |
| CN | 104749874 A | 7/2015 |
| JP | 2006184414 A | 7/2006 |
| JP | 4402582 B2 | 1/2010 |
| WO | WO-2008105531 A1 | 9/2008 |

OTHER PUBLICATIONS

Chinese Office Action regarding Application No. 201510136925.3 dated Apr. 27, 2018. Translation provided by Dragon Intellectual Property Law Firm.

* cited by examiner

--Prior Art--

MASK PLATE, MASK EXPOSURE DEVICE AND MASK EXPOSURE METHOD

CROSS-REFERENCE TO RELATED APPLICATION

This application is the U.S. national phase of PCT Application No. PCT/CN2015/084445 filed on Jul. 20, 2015, which claims a priority to Chinese Patent Application No. 201510136925.3 filed on Mar. 26, 2015, the disclosures of which are incorporated in their entirety by reference herein.

TECHNICAL FIELD

The present disclosure relates to the field of display technology, and in particular to a mask plate, a mask exposure device and a mask exposure method.

BACKGROUND

Generally, a plurality of times of mask exposures is needed in a process of manufacturing a display substrate, and a mask plate with a certain pattern is needed when performing each mask exposure. In the related art, the mask plate is generally an open mask, which includes a bar-shaped or a groove-shaped mask opening. In a process of mask exposure, light passes through the mask opening and irradiates photoresist to pattern the photoresist.

The mask plate in the related art cannot provide a closed-loop shaped mask opening as shown in FIG. 1. When forming a closed-loop shaped pattern, a plurality of times of mask exposures is needed, and this greatly increases production cost and reduce production efficiency. In order to provide a mask with a closed-loop shaped opening, ribs (as shown in a dashed box in FIG. 2) are generally added in the mask plate in the related art. However, this mask plate has disadvantages such as unsatisfactory coating efficiency and unsatisfactory uniformity of a formed film at positions corresponding to ribs, thus an overall quality of the film formed on the substrate is severely affected.

SUMMARY

The present disclosure provides a mask plate, a mask exposure device and a mask exposure method, to provide a mask with a closed-loop shaped opening, so as to improve a quality of a film formed on a substrate.

Technical solutions of the present disclosure are as follows.

In one aspect, a mask plate is provided according to one embodiment of the present disclosure, including a tray with at least one mask locating slot, and a mask arranged in each mask locating slot.

Optionally, the mask locating slot includes at least one array of rectangular slots.

Optionally, the mask locating slot further includes at least one bar-shaped slot arranged at a periphery of the rectangular slots.

Optionally, a shape of the mask corresponds to a shape of the mask locating slot, and a size of the mask is smaller than a size of the mask locating slot.

Optionally, the tray is made of a transparent material.

Optionally, a rectangular mask is arranged in the rectangular slot, and a border mask is arranged in the bar-shaped slot.

Optionally, the rectangular mask in the rectangular slot is isolated from the border mask in the bar-shaped slot.

In another aspect of the present disclosure, a mask exposure device is provided according to one embodiment of the present disclosure, including a platform having one side configured to carry a substrate to be processed, and the mask plate hereinabove arranged at a side of the substrate to be processed, and a side of the mask plate where the mask is arranged facing the substrate to be processed.

Optionally, a mask adsorption plate is arranged on the platform, where the mask adsorption plate is configured to adsorb the mask onto a surface of the substrate to be processed.

Optionally, the mask is made of a metal material, and the mask adsorption plate is arranged at the other side of the platform and is made of a magnetic material.

In yet another aspect of the present disclosure, a mask exposure method is provided according to one embodiment of the present disclosure, which is applied to the mask exposure device hereinabove, including:

arranging the mask plate at a side of the platform where a substrate to be processed is arranged, with the mask of the mask plate facing the substrate to be processed;

adsorbing the mask in the mask locating slot onto a surface of the substrate to be processed; and performing mask exposure on the substrate to be processed which the mask is adsorbed onto.

According to the mask plate, the mask exposure device and the mask exposure method provided according to embodiments of the present disclosure, the mask plate adopts a tray structure with at least one mask locating slot, and the mask is arranged in each mask locating slot. Compared with the mask with the closed-loop opening shown in FIG. 2, in the mask plate of such structure, the mask is carried by the locating slots in such a manner that mask parts are isolated from a border mask part, with no need to connect them with ribs. This can avoid impacts on the quality of the film formed on the substrate caused by unsatisfactory coating efficiency and unsatisfactory uniformity at positions corresponding to ribs, thereby providing an effective mask with a closed-loop shaped opening.

BRIEF DESCRIPTION OF THE DRAWINGS

To illustrate technical solutions of embodiments of the present disclosure clearly, drawings in the description of the embodiments are described briefly. Obviously, the drawings in the following descriptions are merely a part of the embodiments, and those skilled in the art may further obtain other drawings without creative work based on these drawings.

DETAILED DESCRIPTION

To make the objects, technical solutions and advantages of the present disclosure more clear, the embodiments of the present disclosure will be illustrated in details in conjunction with the drawings.

Figure 3:
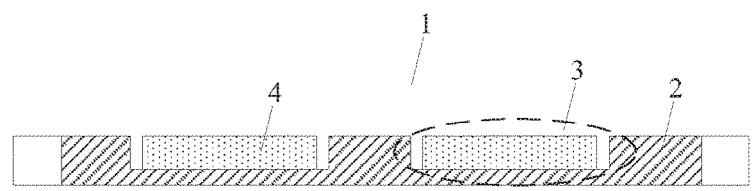
FIG. 3 is a sectional view of a mask plate according to one embodiment of the present disclosure.

As shown in FIG. 3, a mask plate 1 according to one embodiment of the present disclosure includes a tray 2 with at least one mask locating slot 3, and a mask 4 arranged in each mask locating slot 3.

The mask plate according to one embodiment of the present disclosure adopts the tray structure having at least one mask locating slot, and the mask is arranged in each mask locating slot. Compared with the mask with the closed-loop opening shown in FIG. 2, in the mask plate of such structure, the mask is carried by the locating slots in such a manner that mask parts are isolated from a border mask part, with no need to connect them with ribs. This can avoid impacts on the quality of the film formed on the substrate caused by unsatisfactory coating efficiency and unsatisfactory uniformity at positions corresponding to ribs, thereby providing an effective mask with a closed-loop shaped opening.

Figure 4:
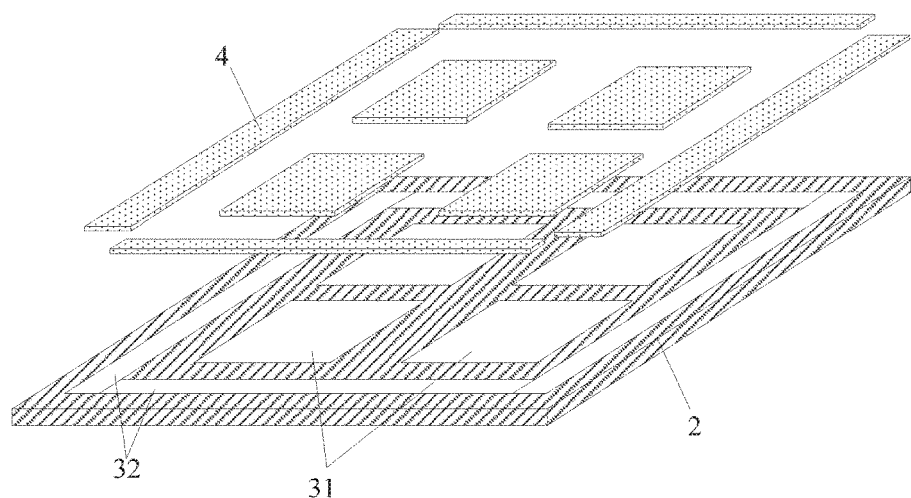
FIG. 4 is a schematic view showing the structure of the mask plate according to one embodiment of the present disclosure.

Further, as shown in FIG. 4, the mask locating slot 3 includes at least one array of rectangular slots 31. The rectangular slot 31 is configured to carry a rectangular mask. In a practical manufacturing process, there is generally a plurality of substrates to be processed arranged in an array on a display substrate motherboard. Positions of the rectangular slots may correspond to positions of the substrates to be processed, and thus patterning may be performed on the pluralities of substrates through one time of patterning process, thereby improving production efficiency.

Further, as shown in FIG. 4, the mask locating slot 3 may further include at least one bar-shaped slot 32 arranged at a periphery of the rectangular slots 31. Bar-shaped mask borders surrounding each rectangular mask may be arranged within the bar-shaped slots 32. There is no need to arrange ribs between the rectangular mask and the bar-shaped mask, thereby providing a mask with the closed-loop shaped opening.

It should be noted that, in some embodiments of the present disclosure, a shape of the mask may correspond to a shape of the mask locating slot, and a size of the mask is smaller than a size of the mask locating slot.

Further, in some embodiments of the present disclosure, the tray 2 may be made of a transparent material. In this way, in a process of mask exposure, when attaching the tray 2 which carries the masks onto a surface of the substrate to be processed, areas of the tray 2 among the masks may form an opening area for light transmission. Such arrangement is easy to use and convenient for designing and manufacturing.

Figure 5:
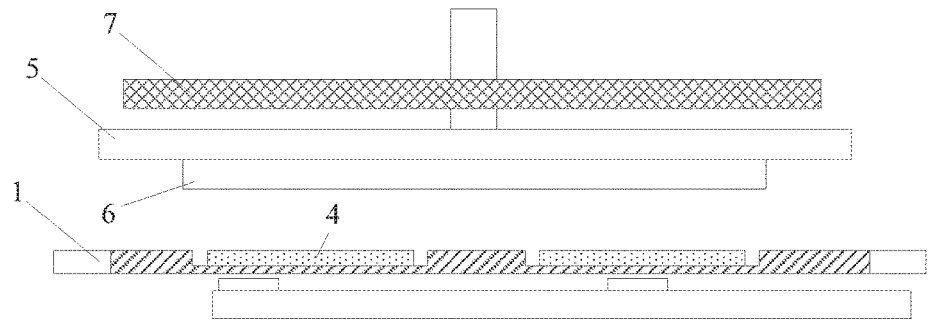
FIG. 5 is a schematic view showing a structure of a mask exposure device according to one embodiment of the present disclosure.

As shown in FIG. 5, a mask exposure device is provided according to one embodiment of the present disclosure, including a platform 5. One side of the platform 5 is configured to carry a substrate 6 to be processed.

The mask plate 1 hereinabove is arranged at another side of the substrate 6 to be processed. One side of the mask 4 of the mask plate 1 faces the substrate 6 to be processed.

The mask exposure device provided according to one embodiment of the present disclosure, includes the mask plate. The mask plate adopts a tray structure with at least one mask locating slot, and the mask is arranged in each mask locating slot. Compared with the mask with the closed-loop opening shown in FIG. 2, in the mask plate of such structure, the mask is carried by the locating slots in such a manner that mask parts (e.g., the rectangular masks) are isolated from a border mask, with no need to connect them with ribs. For example, the rectangular mask in the rectangular slot is isolated from the border mask in the bar-shaped slot by carrying them in locating slots. This can avoid impacts on the quality of the film formed on the substrate caused by unsatisfactory coating efficiency and unsatisfactory uniformity at positions corresponding to ribs, thereby providing an effective mask with a closed-loop shaped opening.

The structure of the mask plate is described in details in the embodiment hereinabove, so the detailed description thereof is omitted herein.

It should be noted that, in a practical process of manufacturing the substrate, a structure shown in FIG. 5 is usually applied. The substrate 6 to be processed is hung on the platform 5, and a lower surface of the substrate 6 to be processed is a surface to be processed. In an exposure process, light passes through the mask plate 1 at a lower side of the substrate 6 to be processed and irradiates the lower surface of the substrate 6 to perform patterning. Of course, the arrangement hereinabove is merely an illustration, and the position where the substrate is arranged is not specifically limited in the embodiment of the present disclosure.

Further, as shown in FIG. 5, a mask adsorption plate 7 may be arranged on the platform 5. The mask adsorption plate 7 is configured to adsorb the mask 4 onto the surface of the substrate 6 to be processed.

To be specific, the mask 4 may be made of a metal material. The mask adsorption plate 7 may be arranged at another side of the platform 5 and may be made of a magnetic material. In this way, in the mask exposure process, when the mask plate 1 carrying the mask 4 approaches to the surface of the substrate 6 to be processed, the mask adsorption plate 7 which is made of the magnetic material, can adsorb and secure the mask 4 onto the surface of substrate 6 to be processed from another side of the substrate 6 to be processed. When performing exposure and development, the tray 2 of the mask plate 1 may be removed from the working area, and only the mask 4 is left. In this way, the quality of exposure and developing may be improved significantly while providing a mask with a closed-loop shaped opening, thereby the exposure may not be influenced by the tray 2.

Figure 6:
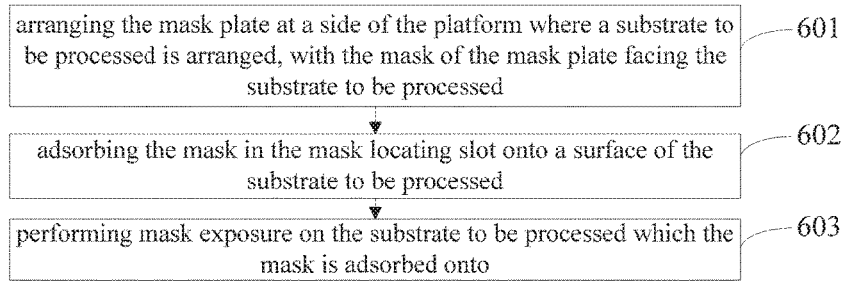
FIG. 6 is a flow chart of a mask exposure method according to one embodiment of the present disclosure.

A mask exposure method is provided according to one embodiment of the present disclosure, and is applicable for the mask exposure device hereinabove. As shown in FIG. 6, the method includes:

Step 601: arranging a mask plate at one side of the platform where a substrate to be processed is arranged, with a mask of the mask plate faces the substrate to be processed;

Step 602: adsorbing the mask in a mask locating slot onto the surface of the substrate to be processed; and Step 603: performing mask exposure on the substrate to be processed which the mask is adsorbed onto.

In the mask exposure method provided according to one embodiment of the present disclosure, the mask plate adopts a tray structure having at least one mask locating slot, and the mask is arranged in each mask locating slot. Compared with the mask with the closed-loop opening shown in FIG. 2, in the mask plate of such structure, the mask is carried by the locating slots in such a manner that mask parts are isolated from a border mask part, with no need to connect them with ribs. This can avoid impacts on the quality of the film formed on the substrate caused by unsatisfactory coating efficiency and unsatisfactory uniformity at positions corresponding to ribs, thereby providing an effective mask with a closed-loop shaped opening.

The structure of the mask exposure device is described in details in the embodiment hereinabove, so the detailed description thereof is omitted herein.

To be specific, by taking the mask exposure device shown in FIG. 5 as example, the mask exposure method provided according to one embodiment of the present disclosure may be described in details.

Figure 7:
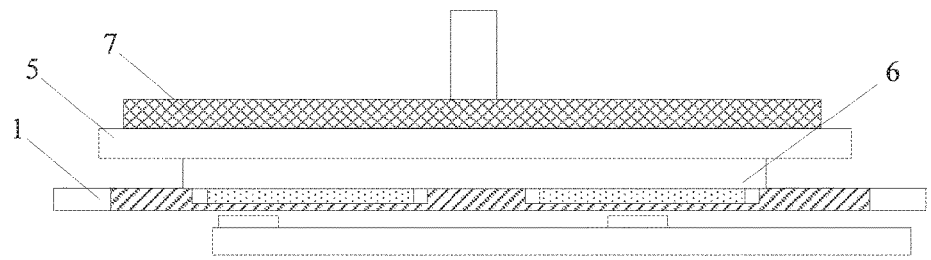
FIG. 7 is a schematic view showing a situation of usage of the mask exposure device according to one embodiment of the present disclosure.

In a process of performing mask exposure on the substrate 6 to be processed, a supporter of the platform 5 for carrying the mask plate 1 moves up, so that the mask plate 1 is attached to the surface of the substrate 6 to be processed. Meanwhile, the mask adsorption plate 7 at the other side of the substrate 6 moves down, so that the mask 4 in the mask plate 1 is adsorbed onto the surface of the substrate 6 to be processed, as shown in FIG. 7.

Figure 8:
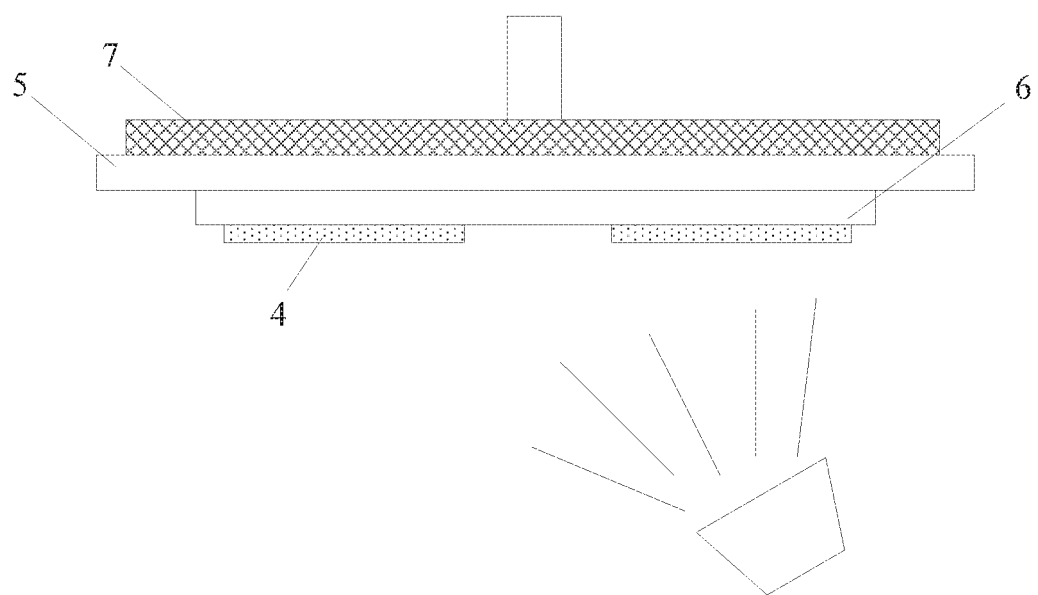
FIG. 8 is a schematic view showing another situation of usage of the mask exposure device according to one embodiment of the present disclosure.

When the mask 4 is adsorbed onto the surface of the substrate 6 to be processed, the lower supporter of the platform 5 for carrying the tray 2 is removed away, so that only the mask 4 is left on the lower surface of the substrate 6 to be processed. At this point, as shown in FIG. 8, the substrate 6 is irradiated by light from the lower side, so as to pattern the photoresist.

After the mask exposure is completed, the steps hereinabove may be performed in reverse order. That is, the lower supporter of the platform 5 for carrying the tray 2 is brought in, so that the position of the mask locating slot corresponds to the mask 4. Then, the mask adsorption plate 7 moves up, so that the mask 4 falls into the mask locating slot 3 again. Finally, the whole mask plate 1 is removed away, and then the entire mask exposure process is completed.

Figure 1:
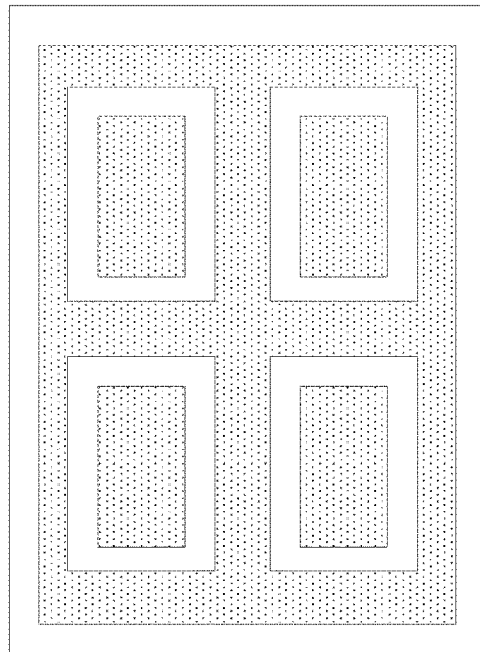
FIG. 1 is a schematic view showing a structure of a mask with a closed-loop shaped opening.
Figure 2:
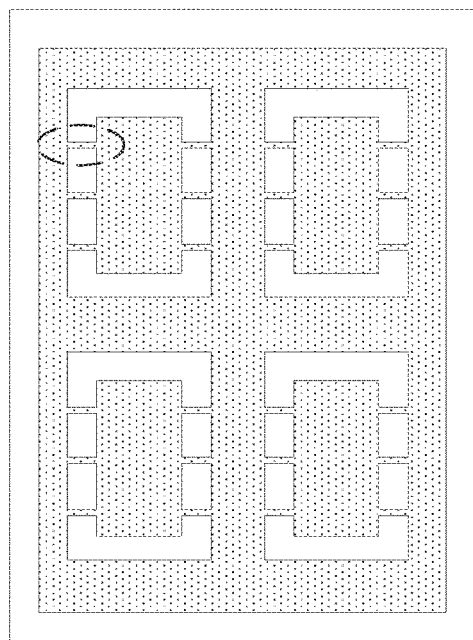
FIG. 2 is a schematic view showing a structure of a mask plate in the related art.

In the mask exposure method adopted the mask plate of such structure, compared with the mask with the closed-loop shaped opening shown in FIG. 2, the mask is carried by the locating slots in such a manner that mask parts are isolated from a border mask part, with no need to connect them with ribs. This can avoid impacts on the quality of the film formed on the substrate caused by unsatisfactory coating efficiency and unsatisfactory uniformity at positions corresponding to ribs, thereby providing an effective mask with a closed-loop shaped opening.

The above descriptions are merely the embodiments of the present disclosure, but the present disclosure is not limited herein. Modifications, equivalent replacements and improvements made by those skilled in the art without departing from the principle and spirit of the present disclosure may fall into the scope of the present disclosure.

What is claimed is:

1. A mask plate, comprising a tray with at least one mask locating slot, and a mask arranged in each mask locating slot, wherein the tray is made of a transparent material;
   wherein the mask locating slot further comprises at least one bar-shaped slot arranged at a periphery of the rectangular slots.

2. The mask plate according to claim 1, wherein the mask locating slot comprises at least one array of rectangular slots.

3. The mask plate according to claim 1, wherein a shape of the mask corresponds to a shape of the mask locating slot, and a size of the mask is smaller than a size of the mask locating slot.

4. The mask plate according to claim 1, wherein the mask comprises a rectangular mask arranged in the rectangular slot, and a border mask arranged in the bar-shaped slot.

5. The mask plate according to claim 4, wherein the rectangular mask in the rectangular slot is isolated from the border mask in the bar-shaped slot.

6. A mask exposure device, comprising:
   a platform having one side configured to carry a substrate to be processed; and
   the mask plate according to claim 1 arranged at a side of the substrate to be processed, a side of the mask plate where the mask is arranged facing the substrate to be processed.

7. The mask exposure device according to claim 6, further comprising a mask adsorption plate arranged on the platform; wherein the mask adsorption plate is configured to adsorb the mask onto a surface of the substrate to be processed.

8. The mask exposure device according to claim 7, wherein the mask is made of a metal material, and the mask adsorption plate is arranged at the other side of the platform and is made of a magnetic material.

9. The mask exposure device according to claim 8, further comprising a supporter for carrying the mask plate.

10. A mask exposure method, applied to the mask exposure device according to claim 6, the method comprising:
    arranging the mask plate at a side of the platform where a substrate to be processed is arranged, with the mask of the mask plate facing the substrate to be processed;
    adsorbing the mask in the mask locating slot onto a surface of the substrate to be processed; and
    performing mask exposure on the substrate to be processed which the mask is adsorbed onto.

11. The mask plate according to claim 1, wherein the mask locating slot comprises at least one rectangular slot.

* * * * *